US006580516B1

United States Patent
Tucker et al.

(10) Patent No.: US 6,580,516 B1
(45) Date of Patent: Jun. 17, 2003

(54) TUNABLE FABRY PEROT MICROELECTROMECHANICAL RESONATOR ADAPTED FOR OPTICAL FILTERS AND LASERS WITH REDUCED OPTICAL POWER-DEPENDENT TUNING

(75) Inventors: Rodney S. Tucker, Hawthorn (AU); Wayne V. Sorin, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 227 days.

(21) Appl. No.: 09/703,546

(22) Filed: Nov. 1, 2000

(51) Int. Cl.⁷ .................................. G01B 9/02
(52) U.S. Cl. ........................................ 356/519
(58) Field of Search ................... 356/519, 454

(56) References Cited

U.S. PATENT DOCUMENTS

| | | | | |
|---|---|---|---|---|
| 5,137,361 A | * | 8/1992 | Heon et al. | 356/502 |
| 5,142,414 A | * | 8/1992 | Koehler | 356/519 |

* cited by examiner

Primary Examiner—Samuel A. Turner
Assistant Examiner—Michael A. Lyons

(57) ABSTRACT

A tunable optical resonator constructed from a fixed mirror and a moveable mirror. The fixed mirror is attached to a substrate having a first electrically conducting surface. A support member having the moveable mirror supported thereon and a second electrically conducting surface is suspended above the substrate such that the moveable mirror is separated from the fixed mirror. A light output port transmits a light signal of a wavelength determined by the distance between the fixed and moveable mirrors. An optical circuit measures the power level of the light signal and generates an electrical signal that depends on the measured power level. A frequency adjustment circuit, responsive to the electrical signal and a tuning voltage, applies an electrical potential between the first and second electrically conducting surfaces. The electrical potential causes the distance to remain at a distance determined by the tuning voltage independent of the power level for power levels less than a predetermined power level. The resonator can be used to construct a laser by incorporating an active layer for amplifying light trapped in the cavity. The resonator can also be used a tunable optical filter by including an input port for receiving a light signal that is to be filtered. In one embodiment of the invention, a feedback circuit consisting of an optical coupler, photodiode, amplifier, and signal adder is used to generate the potential between the first and second electrically conducting surfaces.

7 Claims, 2 Drawing Sheets

TUNABLE FABRY PEROT MICROELECTROMECHANICAL RESONATOR ADAPTED FOR OPTICAL FILTERS AND LASERS WITH REDUCED OPTICAL POWER-DEPENDENT TUNING

FIELD OF THE INVENTION

The present invention relates to optical filters, and more particularly, to tunable Fabry-Perot optical resonators, and filters and lasers constructed therefrom.

BACKGROUND OF THE INVENTION

Tunable optical resonators are utilized in optical communication systems and in the construction of lasers. Optical filters and lasers based on Fabry-Perot resonators can be constructed using microelectromechanical (MEM) machining techniques, and hence, in principle, can provide an economically attractive tunable filter or tunable laser. In such devices, a Fabry-Perot resonator cavity is formed between two mirrors. One of these mirrors is flat and located on a semiconductor substrate. The other mirror may be curved and is suspended on a number of micro-mechanical cantilevers. Application of a tuning voltage between the cantilevers and the substrate causes the suspended mirror to move towards the fixed mirror on the substrate, thereby reducing the spacing between the two mirrors of the Fabry-Perot resonator. Since the filter's bandpass frequency is determined by the mirror spacing, a reduction in spacing between the two mirrors causes the resonant optical frequency of the cavity to increase. The shift in the resonant frequency enables the device to be used directly as a tunable bandpass filter. If an optically-pumped or electrically-pumped optical gain medium (active region) is placed in the cavity, the device becomes a tunable laser, with the lasing wavelength controlled by the resonant frequency of the Fabry-Perot cavity.

In many prior art MEM Fabry-Perot resonators the tuning voltage needed to provide a specific resonance frequency depends on the power in the light that is resonating within the cavity. This power dependent tuning makes the use of such resonators difficult in applications in which the power level in the resonator changes with time.

Broadly, it is the object of the present invention to provide an improved MEM Fabry-Perot resonator.

It is a further object of the present invention to provide a MEM Fabry-Perot resonator having a tuning voltage that is independent of the optical power level in the resonator.

These and other objects of the present invention will become apparent to those skilled in the art from the following detailed description of the invention and the accompanying drawings.

SUMMARY OF THE INVENTION

The present invention is a tunable optical resonator constructed from a fixed mirror and a moveable mirror. The fixed mirror is attached to a substrate having a first electrically conducting surface. A support member having the moveable mirror supported thereon and a second electrically conducting surface is suspended above the substrate such that the moveable mirror is separated from the fixed mirror. A light output port transmits a light signal of a wavelength determined by the distance between the fixed and moveable mirrors. An optical circuit measures the power level of the light signal and generates an electrical signal that depends on the measured power level. A frequency adjustment circuit, responsive to the electrical signal and a tuning voltage, applies an electrical potential between the first and second electrically conducting surfaces. The electrical potential causes the distance to remain at a value determined by the tuning voltage independent of the power level for power levels less than a predetermined power level. The resonator can be used to construct a laser by incorporating an active layer for amplifying light trapped in the cavity. The resonator can also be used as a tunable optical filter by including an input port for receiving a light signal that is to be filtered. In one embodiment of the invention, a feedback circuit consisting of an optical coupler, photodiode, amplifier, and signal adder is used to generate the potential between the first and second electrically conducting surfaces.

BRIEF DESCRIPTION OF THE INVENTION

DETAILED DESCRIPTION OF THE INVENTION

Figure 2:
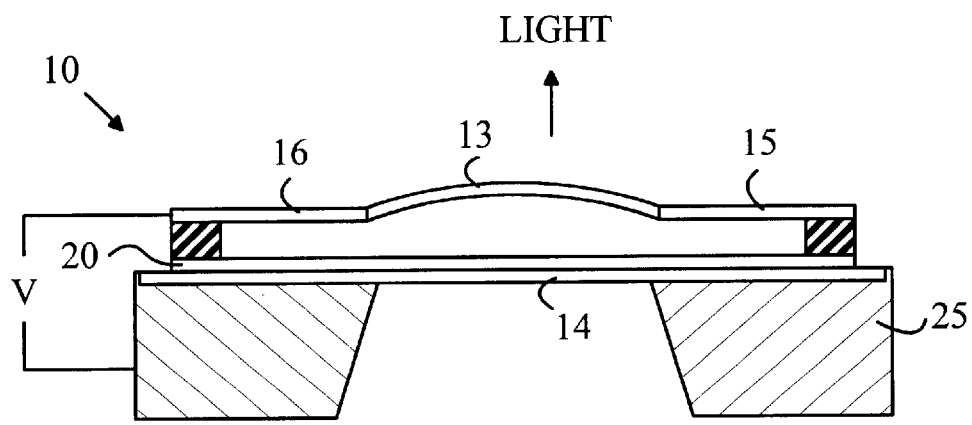
FIG. 2 is a cross-sectional view of the laser shown in FIG. 1 through line 11–12.
Figure 1:
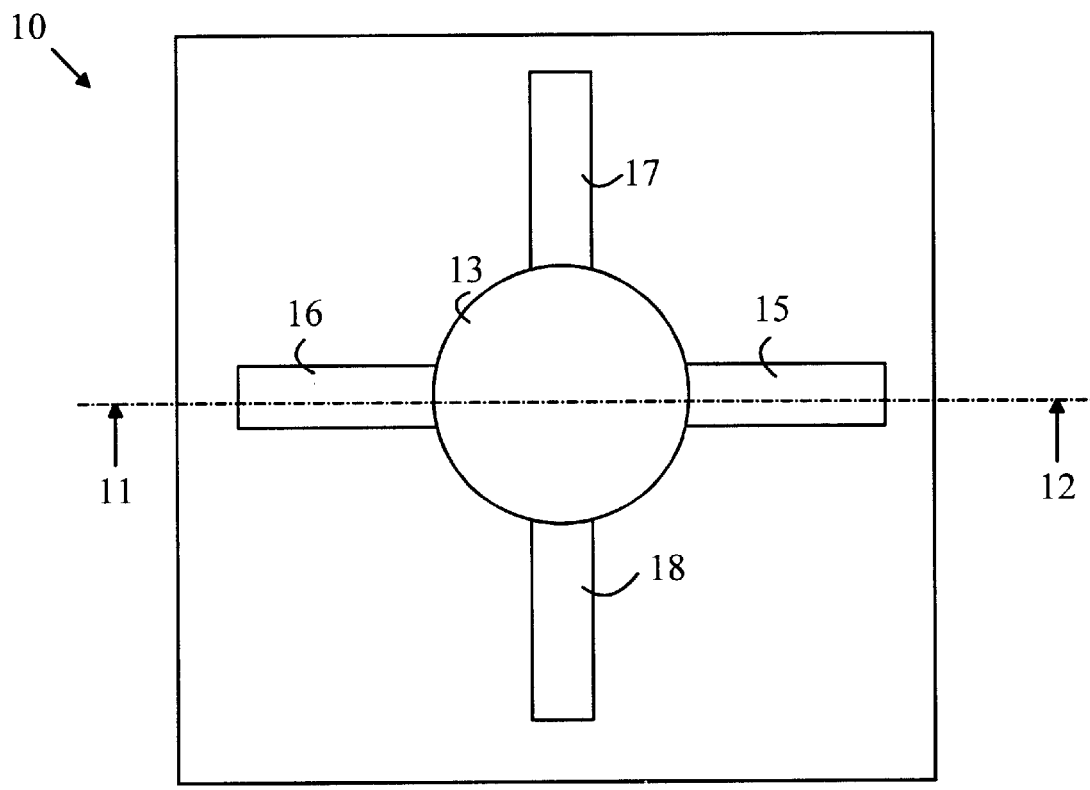
FIG. 1 is a top view of a Fabry-Perot based filter or laser.

The present invention may be more easily understood with reference to FIGS. 1 and 2. FIG. 1 is a top view of a Fabry-Perot based filter or laser. FIG. 2 is a cross-sectional view of the laser shown in FIG. 1 through line 11–12. A Fabry-Perot resonator cavity is formed between mirrors 13 and 14. Mirror 14 is flat and located on a semiconductor substrate 25. The mirror 13 is typically curved and is suspended on a number of micro-mechanical cantilevers shown at 15–18. The mirrors are preferably constructed from a number of layers of transparent material having indices of refraction that alternate from layer to layer. Such mirrors are well known to the art of semiconductor lasers and filters, and hence, will not be discussed in detail here. To simplify the drawing, the layered structure of the mirrors has been omitted. At least one of the mirrors is partially transmitting and acts as a port for allowing light to enter and/or leave the filter.

The application of a tuning voltage between the cantilevers and the substrate causes suspended mirror 13 to move towards mirror 14, thereby reducing the spacing between the two mirrors of the Fabry-Perot cavity. Since the resonant frequency of the cavity is determined by the distance between the mirrors, this reduction in spacing between the two mirrors causes the resonant optical frequency of the cavity to increase. The shift in the resonant frequency enables the device to be used directly as a tunable bandpass filter. If an optically-pumped or electrically-pumped optical gain medium 20 is placed in the cavity, the device becomes a tunable laser, with the lasing wavelength controlled by the resonant frequency of the Fabry-Perot cavity.

A key feature of the MEM filter and MEM tunable laser is the relatively small spacing between the two mirrors of the optical cavity. Mirror spacings of a few microns can be utilized with a tuning range of 60 nanometers or more, for an input tuning voltage range of about 30 volts.

As noted above, prior art devices of the type shown in FIGS. 1 and 2 suffer from an undesirable optical power level dependent tuning voltage. That is, the tuning voltage needed to set the resonance frequency at any given value depends on the optical power level in the cavity for power levels above some predetermined value that depends on the physical characteristics of the device. At higher power levels, the filter response (i.e., transmission as a function of wavelength) becomes asymmetrical and exhibits a sudden drop in output power at some critical input wavelength. The critical wavelength depends upon the optical power level. In effect, the filter exhibits hysteresis-like behavior and this hysteresis can be sufficiently large to render the filter useless in many applications.

The present invention is based on the observation that the shift in tuning voltage is the result of the radiation pressure in the cavity. The radiation force tends to push the moving mirror in the Fabry-Perot cavity away from the fixed mirror. Thus, the radiation force tends to tune the filter of the laser to longer wavelengths. The magnitude of the radiation force is proportional to the internal optical power in the cavity, and is also proportional to the optical output power from the filter.

Figure 3:
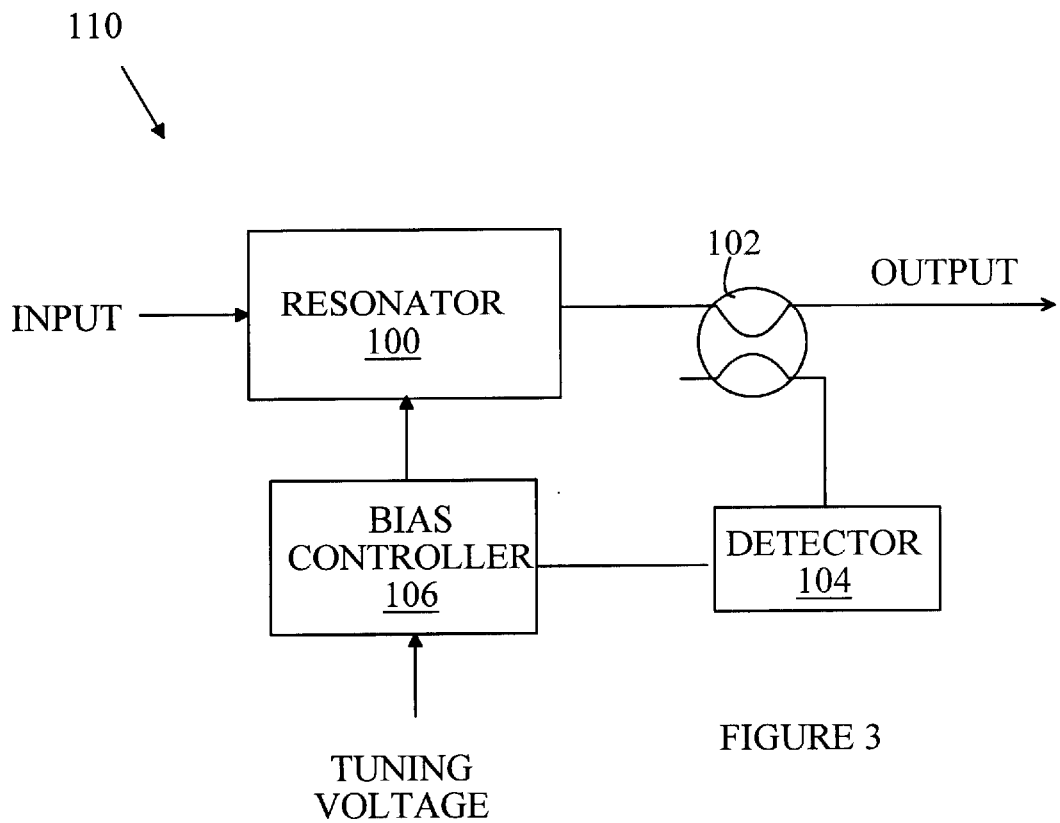
FIG. 3 is a block diagram of a Fabry-Perot filter assembly 110 according to the present invention in which a feed back circuit corrects the tuning voltage.

The manner in which the present invention corrects the tuning voltage for the radiation pressure can be more easily understood with reference to FIG. 3 which is a block diagram of a Fabry-Perot filter assembly 110 according to the present invention in which a feed back circuit corrects the tuning voltage. The resonator 100 is substantially the same as that shown in FIGS. 1 and 2. The resonator may include an active gain medium, in which case, the resonator becomes a laser. An optical coupler 102 at the output of resonator 100 couples some of the optical output power into a detector 104, such as a photodiode. The output of this detector is preferably proportional to the optical output power from resonator 100, and is therefore proportional to the radiation force on the movable mirror. The output from detector 104 is used as a correction input to a bias controller 106, which generates a correction signal that is added to the tuning voltage such that the resultant combined signal maintains the mirrors at the correct spacing independent of the power output by the resonator.

Figure 4:
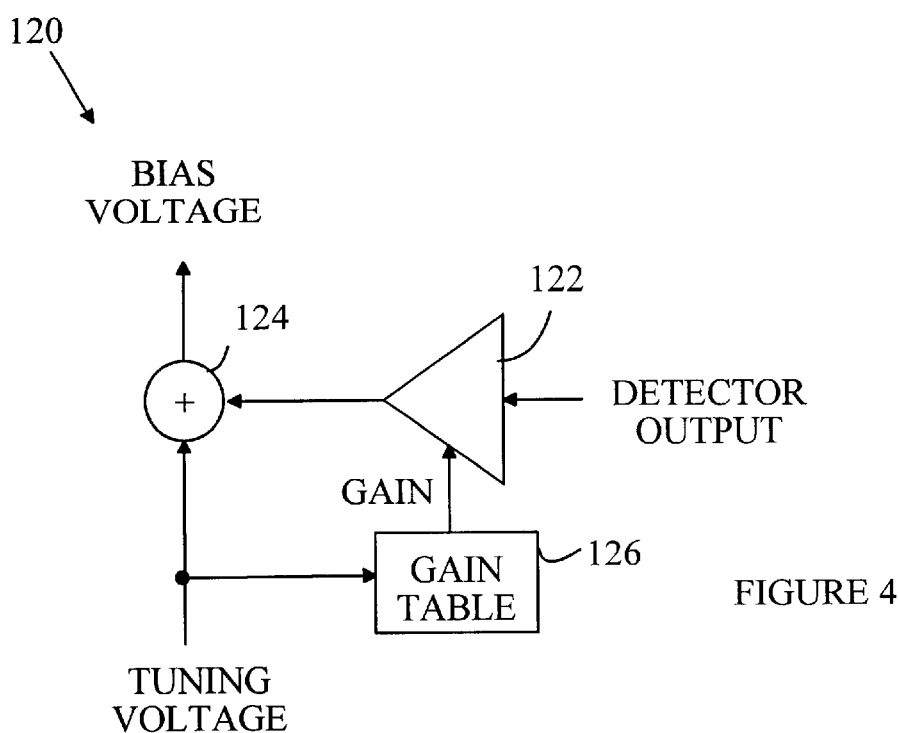
FIG. 4 is a block diagram of the preferred embodiment of a bias control circuit.

The simplest embodiment of the bias controller is shown at 120 in FIG. 4, which is a block diagram of the preferred embodiment of a bias control circuit. Bias controller 120 consists of a non-inverting amplifier 122 and a signal adder 124 that combines the output of the amplifier with the input tuning voltage. The gain constant, B, of the non-inverting amplifier must be determined to provide the correct operation. For a given fixed tuning voltage, the bias voltage, V, applied to the resonator is increased by a small amount when the detected output power, P, increases. The increase in bias voltage is proportional to the increase in the optical output power, i.e., the potential applied to the moving mirror is V+BP. The small increase in the tuning voltage, BP, applied to the filter, increases the electrostatic force that sets the mirror spacing by a small amount. Since the electrostatic force acts in the opposite direction to the radiation force, the small increase in electrostatic force can be made to exactly cancel the radiation force by correctly setting the gain B of the amplifier.

If the bias controller is required to operate over a wide range of tuning voltages, a more complex bias control circuit is needed. The electrostatic force that controls the mirror spacing depends on the square of the voltage that is applied between the mirror and the substrate. As a result of this square-law characteristic, the change in electrostatic force for a small change in applied voltage will depend on the total bias voltage on the resonator. To account for this bias-voltage-dependent sensitivity to tuning voltage, it is necessary to adjust the gain of the non-inverting amplifier in response to the changing bias voltage. In embodiments of the present invention designed to operate over a wide range of tuning voltages, bias controller 106 stores a table 126 of gain constants for the amplifier and selects the appropriate gain constant based on the input tuning voltage. The gain constants can be determined experimentally by calibrating the resonator frequency as a function of bias voltage at different output power levels.

While the preferred embodiment of the bias controller utilizes an amplifier, a signal adder, and a gain table, it will be obvious to those skilled in the art from the preceding discussion that other circuit arrangements may be utilized. In general, a calibration circuit that is to operate over a wide range of tuning voltages needs to include a table or other means of determining tuning voltage corrections that depend on the tuning voltage and the output power of the resonator. The entries in this table may be determined experimentally by measuring the resonance frequency of the resonator as a function of bias voltage at different output power levels.

Various modifications to the present invention will become apparent to those skilled in the art from the foregoing description and accompanying drawings. Accordingly, the present invention is to be limited solely by the scope of the following claims.

What is claimed is:

1. A tunable optical resonator comprising:
    a fixed mirror attached to a substrate having a first electrically conducting surface;
    a support member having a moveable mirror supported thereon, said support member having a second electrically conducting surface, said support member being suspended above said substrate such that said moveable mirror is separated from said fixed mirror by a distance;
    a light output port for transmitting a light signal of a wavelength determined by said distance, said transmitted light signal being characterized by a power level;
    an optical circuit for measuring said power level of said light signal and for generating an electrical signal that depends on said measured power level; and
    a frequency adjustment circuit, responsive to said electrical signal and a tuning voltage, for applying an electrical potential between said first and second electrically conducting surfaces, wherein said electrical potential causes said distance to remain at a distance determined by said tuning voltage independent of said power level for power levels less than a predetermined power level.

2. The optical resonator of claim 1 further comprising an active layer for amplifying light trapped in said cavity.

3. The optical resonator of claim 1 further comprising an input port for receiving a light signal that is reflected between said fixed and moveable mirrors.

4. The optical resonator of claim 1, wherein said optical circuit comprises an optical coupler and a light to electrical converter.

5. The optical resonator of claim 4 wherein said electrical converter is a photodiode.

6. The optical resonator of claim 1, wherein said frequency adjustment circuit comprises a non-inverting amplifier and adder, said electrical potential being proportional to V+BP, where V is said tuning voltage, P is said measured power, and B is a constant.

7. The optical resonator of claim 6, wherein B is a function of said tuning voltage.

* * * * *